United States Patent [19]

Sawa et al.

[11] Patent Number: 4,952,935
[45] Date of Patent: Aug. 28, 1990

[54] RADIOWAVE ABSORBER AND ITS MANUFACTURING PROCESS

[75] Inventors: Shinnosuke Sawa, Matsuyama; Shunichi Kumaoka; Teruo Ohno, both of Tokyo, all of Japan

[73] Assignee: Shinwa International Co., Ltd., Tokyo, Japan

[21] Appl. No.: 262,777

[22] Filed: Oct. 26, 1988

[30] Foreign Application Priority Data

Jul. 18, 1988 [JP] Japan .................. 63-178839

[51] Int. Cl.$^5$ .............................................. B05D 5/12
[52] U.S. Cl. ........................................ 342/4; 427/122
[58] Field of Search ............... 342/1, 5, 4; 181/299, 181/296; 428/323; 427/116, 122

[56] References Cited

U.S. PATENT DOCUMENTS

| | | | |
|---|---|---|---|
| 3,568,195 | 3/1971 | Wesch et al. | 343/18 |
| 3,680,107 | 7/1972 | Meinke et al. | 343/18 A |
| 3,721,982 | 3/1973 | Wesch | 343/18 A |
| 3,938,152 | 2/1976 | Grimes et al. | 343/18 A |
| 4,023,174 | 5/1977 | Wright | 343/18 X |
| 4,024,318 | 5/1977 | Forster et al. | 428/519 |
| 4,084,161 | 4/1978 | Manning et al. | 343/18 A |
| 4,283,457 | 8/1981 | Kolsky et al. | 181/294 X |
| 4,358,772 | 11/1982 | Leggett | 343/872 |
| 4,465,984 | 8/1984 | McDowell | 333/81 A |
| 4,538,151 | 8/1985 | Hatakeyama et al. | 343/18 A |
| 4,604,276 | 8/1986 | Oblas et al. | 252/507 X |
| 4,698,256 | 10/1987 | Giglia et al. | 428/216 |
| 4,748,449 | 5/1988 | Landers, Jr. et al. | 343/705 |
| 4,752,525 | 6/1988 | Oyachi et al. | 428/364 X |
| 4,786,548 | 11/1988 | Place, Jr. | 428/245 X |

FOREIGN PATENT DOCUMENTS

| | | |
|---|---|---|
| 50-68249 | 6/1975 | Japan . |
| 54-61239 | 5/1979 | Japan . |
| 54-127000 | 10/1979 | Japan . |
| 55-36987 | 3/1980 | Japan . |
| 57-34396 | 2/1982 | Japan . |
| 57-34398 | 2/1982 | Japan . |
| 61-194701 | 8/1986 | Japan . |
| 62-6680 | 2/1987 | Japan . |
| 62-45100 | 2/1987 | Japan . |
| 62-81799 | 4/1987 | Japan . |
| 62-112400 | 5/1987 | Japan . |

Primary Examiner—Peter A. Nelson
Attorney, Agent, or Firm—Armstrong, Nikaido, Marmelstein, Kubovcik & Murray

[57] ABSTRACT

A radiowave absorber comprises a porous ceramic matrix combined with carbon, where the carbon is combined on its surface and interior particularly in an amount not exceeding 2.7% by weight. A process for manufacturing a radiowave absorber is also disclosed. At least one kind of ceramic material selected from natural minerals or clay minerals, and artificial ceramic materials, is fired with a pore- or skeleton-forming material which can be burned away, whereby a sintered porous ceramic matrix is prepared. The matrix is fired in a furnace containing a reducing atmosphere and having a uniform temperature, while a gas or mist of hydrocarbon compound is introduced into the furnace.

5 Claims, 1 Drawing Sheet

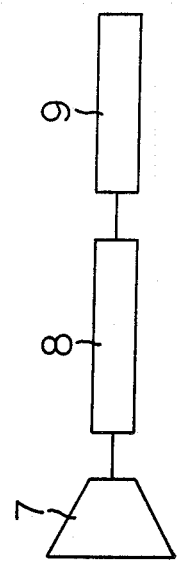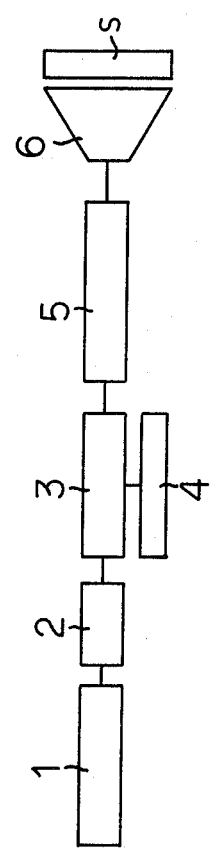

RADIOWAVE ABSORBER AND ITS MANUFACTURING PROCESS

BACKGROUND OF THE INVENTION

1. Field of the Invention:

This invention relates to a radiowave absorber and its manufacturing process.

2. Description of the Prior Art:

A radiowave absorbing body is a material which absorbs a radio wave falling on it and dissipates its energy by converting it to heat, so that no reflected wave may be produces. Various types of radiowave absorbers are used for various purposes, e.g. for preventing the appearance of any ghost on the screen of a television or radar receiver, for constructing a darkroom which admits no radiowave, and for making an electromagnetic shield. An absorber which is made of e.g. ferrite or concrete is used for preventing the appearance of a ghost on a television screen. An absorber made of e.g. rubber and ferrite, or rubber and carbon, is used for preventing the appearance of a ghost on a radar screen. A multilayer or pyramid-shaped absorber which is formed from a polystyrene foam and carbon is used for constructing a darkroom admitting no radiowave.

The development of improved radiowave absorbers is desired. They include an absorber having a small thickness, or weight, one which can absorb waves having a wider range of frequencies, and one which can itself be used as a structural material. Although some reduction in weight has already been achieved, it will be necessary to realize an absorber having a by far smaller weight. A radiowave absorber which can be used directly as a strutural member will certainly find a wide scope of use. As a matter of fact, there are a wide variety of demands for different forms of absorbers which can be used as structural members for constructing various kinds of structures. An absorber of the type which can be mixed with various kinds of other materials, such as a paint, a synthetic resin, glass fibers and cement, when it is used, will also be very useful for a wide variety of applications. The radiowave absorbers are also required to have sufficiently high degrees of heat, chemical and weather resistance.

SUMMARY OF THE INVENTION

It is, therefore, an object of this invention to provide a radiowave absorber which is excellent in heat, chemical and weather resistance, has a light weight, and can be used directly as a structural member.

It is another object of this invention to provide a radiowave absorber which can be mixed with various kinds of other materials when it is used.

The radiowave absorber of this invention essentially comprises a porous ceramic matrix combined with carbon.

It is still another object of this invention to provide a process which can be employed easily for manufacturing an improved radiowave absorber.

The process of this invention essentially comprises firing one or more kinds of natural or artificial ceramic materials with a pore- or skeleton-forming material which can be burned away, so that a porous ceramic matrix may be obtained as a sintered product, and firing the matrix in the presence of a reducing atmosphere in a furnace having a uniform temperature, while introducing a gas or mist of a hydrocarbon compound into the furnace, whereby the resulting carbon combines with the surface and interior of the matrix.

The radiowave absorber of this invention has a light weight, as its porous ceramic matrix has a bulk density of only 0.3 to 0.7. It is, therefore, of great use as a structural member. It is also excellent in heat, chemical, corrosion and wear resistance. Moreover, it can absorb radiowaves more effectively than any known radiowave absorber, as its matrix has a specific surface area of, say, 0.10 to 25 $m^2/g$ and provides, therefore, a large area in which carbon having a high power of absorbing radiowaves can combine with the matrix.

The radiowave absorber of this invention is also very easy to manufacture, since the process for manufacturing it is essentially so simple as merely comprises sintering a ceramic powder with a pore- or skeleton-forming material which can be burned away in an oxidizing atmosphere, and firing the sintered product in a reducing atmosphere.

The radiowave absorber of this invention is useful as a structural member if it is formed in the shape of a plate or block. It can also be prepared in the form of a powder or granular material, so that it may be mixed with various kinds of other materials, such as a synthetic resin, rubber, a paint, textile fibers, glass fibers or cement, to form a composite material which is useful for a wide range of application.

Other features and advantages of this invention will become apparent from the following description and the accompanying drawing.

BRIEF DESCRIPTION OF THE DRAWING

The drawing is a block diagram showing an apparatus which can be employed for determining the radiowave absorption characteristics of the radiowave absorber according to this invention.

DETAILED DESCRIPTION OF THE INVENTION

The radiowave absorber of this invention comprises a porous ceramic matrix which is prepared by sintering a ceramic powder with a pore- or skeleton-forming material which can be burned away. Examples of the ceramic materials which can be employed include natural minerals or clay minerals, such as ones belonging to the classes of silica, alumina, silica-alumina, lime, magnesia, zirconia, chrome minerals and carbonaceous minerals, and artificial ceramics, such as alumina, cordierite type materials, synthetic magnesia, synthetic dolomite, zirconia, spinels, synthetic mullite, titania, aluminum or silicon nitride or other nitrides, and silicon carbide or other carbides. One of these materials or a mixture of two or more materials can be employed without any limitation in particular.

Examples of the pore- or skeleton-forming material which can be employed include fragments of wood, rice hulls, pulp sludge, an organic polyisocyanate compound, a soft polyurethane foam, a porous polyvinyl acetal resin, or other organic compounds, and inorganic materials such as perlite and obsidian. It is beneficial to use, for example, a crushed material having a uniformly controlled range of particle sizes, or a material which has been foamed by heat treatment. A mixture of the ceramic material and the pore-forming material is molded, or the skeleton-forming material is impregnated with a sludge of the ceramic material or is otherwise caused to hold it. After the molded or otherwise prepared mixture has been fully dried, it is fired to make a sintered matrix having a particular shape. While the sintering temperature depends on the composition and proportion of the ceramic material which is employed, a temperature of 900° C. to 1900° C. is usually appropriate for producing a sintered porous ceramic matrix in an oxidizing atmosphere.

The porous structure of the matrix which is obtained depends on the pore- or skeleton-forming material which is employed. A matrix having numerous continuous pores is obtained if a kneaded mixture of a ceramic material, water and a crushed product of fragments of wood or rice hulls employed as a pore-forming material is molded and the molded body which has been fully dried is sintered at a temperature of 1350° C. to 1370° C. It is possible to prepare a matrix which is substantially of the closed-cell structure, but also has continuous pores, if a kneaded mixture of a ceramic material, water and an inorganic pore-forming material, such as perlite, or an organic one, such as a resin, in the form of pellets, is molded and the molded body which has been fully dried is sintered at a temperature of 1200° C. to 1300° C. A matrix of the three-dimensional mesh structure having a continuous inner space can be produced if a soft polyurethane foam from which the cell membranes have been removed is molded and impregnated with a sludge of a ceramic material and the molded body which has been fully dried after the removal of any excess of the sludge is sintered at a temperature of 1500° C. to 1800° C.

In either event, the matrix is porous and has continuous pores. The matrix is fired in the presence of a hydrocarbon compound in a furnace in which a reducing atmosphere prevails, so that the hydrocarbon may be reduced and the resulting carbon may combine with the matrix to yield a radiowave absorber. This treatment is carried out by introducing a gas or mist of the hydrocarbon compound into the furnace having a temperature which is higher than 500° C. This temperature has an important bearing on the amount of the carbon which combines with the matrix, and the length of time which is required for the treatment. The higher the temperature, the larger amount of carbon combines with the matrix and the shorter time is required.

The furnace which can be employed is, for example, a furnace of the type having the function of smoking, a furnace in which a reducing atmosphere prevails, or a vacuum furnace. Examples of the hydrocarbons which can be employed include natural gas, domestic propane gas, industrial fuel gas, kerosene and A heavy oil. More specifically, it is possible to use gaseous or liquid hydrocarbons having up to 17 carbon atoms, for example, chain hydrocarbons such as methane, ethane, propane, butane and acetylene, or cyclic hydrocarbons such as hexane, benzene and xylene.

The gas or mist of hydrocarbon is introduced into the furnace having a temperature which is higher than 500° C., but is usually not in excess of 1200° C. It is introduced continuously. If this range of temperature is employed, a period of six to 65 minutes is usually sufficient for finishing the treatment.

The amount of carbon which combines with the matrix can be controlled if the hydrocarbon which is employed is appropriately selected, and if the temperature of the furnace at the moment when it begins to be introduced, and the length of time for which it is introduced into the furnace are appropriately controlled. The temperature of the furnace is controlled to restrict the growth of carbon due to thermal decomposition in the gas phase and the growth of carbon within the matrix.

The matrix may combine with carbon up to a maximum of about 2.7% by weight. A preferred carbon range is from 0.06 to 2.7% by weight. If the matrix combines with a smaller amount of carbon, the radiowave absorber has a lower radiowave absorptance and a higher radiowave transmittance. If it combines with over 2.7% by weight of carbon, the absorber exhibits an extremely high reflectance, though its transmittance may be satisfactorily low. However, if the temperature of the treatment is not higher than 500° C., or if the supply of hydrocarbon into the furnace is continued for only a period of five minutes or less, the absorber exhibits an extremely high transmittance, even if its amount of combined carbon may lie within the range which has hereinabove been stated.

The radiowave absorber of this invention is useful as a structural member if it is prepared in the shape of a plate or block. Insofar as its reflectance, absorptance and transmittance vary with amount of the carbon combined with the matrix, it is beneficial to employ a plurality of absorber plates or blocks having different amount of combined carbon. A radiowave absorber which can absorb radiowaves very effectively can, for example, be assembled by employing a plate having a relatively low amount of cambined carbon and therefore a low reflectance as a surface layer and plates having gradually increasing carbon contents and therefore gradually increasing degrees of absorptance to form inner layers one upon another.

The absorber of this invention can also be prepared in powdery or granular form. This form of absorber can be produced by crushing the matrix either before or after it is fired in a reducing atmosphere. It can be mixed with various kinds of organic or inorganic materials, such as a synthetic resin, rubber, a paint, textile fibers, paper glass fibers or cement, to form various types of composite materials.

The radiowave absorber of this invention has a large number of advantages owing to its porous ceramic matrix and the carbon with which it is combined. The matrix has a low radiowave reflectance. It has a porosity of 60 to 90% and a bulk specific gravity of 0.3 to 0.7. Therefore, it has a light weight. It is excellent in heat, weather, chemical, corrosion and wear resistance. It has a specific surface area of, say, 0.10 to 25 $m^2/g$ due to its porous structure. Carbon, which works as an effective radiowave absorber, combines with continuous pores and all of the walls of the pores, and therefore, occupies a very large area in which radiowaves can be absorbed very effectively.

The absorber of this invention can absorb radiowaves by far more effectively than any known radiowave absorber formed by employing carbon, carbon fibers, etc. This is due to the special treatment which is employed for causing carbon to combine with the matrix, as hereinabove described. For example, the absorber of this invention having a thickness of, say, 4 cm exhibits a radiowave absorbing efficiency which is 10 to 100 times higher than that of any known absorber having the same thickness. Moreover, this invention makes it easy to obtain radiowave absorbers having different degrees of reflectance, since the carbon density of the matrix is easy to control, as hereinabove described.

The invention will now be described more specifically with reference to a wide variety of examples. These examples are, however, not intended for limiting the scope of this invention. Three kinds of matrixes, A, B and C, will appear in the following description of the examples. The following is a description of the process which was employed for preparing each kind of matrix:

A: A powder of gairome clay (clay consisting mainly of kaolin) and feldspar was mixed with sawdust employed as a pore-forming material. The mixture was kneaded with water and the kneaded mixture was molded. After the molded mixture had been fully dried, it was fired at a temperature of 1320° C. in an oxidizing atmosphere, whereby the sawdust was burned away and a sintered porous ceramic matrix having numerous continuous pores was obtained. The matrix had a porosity of 76 to 84%, a bulk specific gravity of 0.32 to 0.45 and a specific surface area of 16 to 22 $m^2/g$.

B: A powder of diatomaceous earth and kibushi clay (clay consisting mainly of kaolin) was mixed with a foam which had been made to form bubbles by firing perlite and obsidian and was employed as a pore-forming material. The mixture was kneaded with water and the kneaded mixture was molded. After the molded mixture had been fully dried, it was fired at a temperature of 1250° C. in an oxidizing atmosphere to yield a sintered porous ceramic matrix which was substantially of the close-cell structure, but also had continuous pores or open cells. The matrix had a porosity of 40 to 60%, a bulk specific gravity of 0.5 to 0.8 and a specific surface area of 0.8 to 1.7 $m^2/g$.

C: A sludge was prepared from a powder of silica, alumina and magnesia. A soft polyurethane foam from which the cell membranes had been removed was employed as a skeleton-forming material and was dipped in the sludge. After the excess of the sludge had been removed from the foam, the sludge adhering to the foam was fully dried. Then, it was fired at a temperature of 1700° C. in an oxidizing atmosphere, whereby the foam was burned away and a sintered porous ceramic matrix of the three-dimensional structure with a mesh-like appearance having a continuous inner space was obtained. The matrix had a porosity of 78 to 89%, a bulk specific gravity of 0.35 to 0.5 and a specific surface area of 0.19 to 0.25 $m^2/g$.

Then, in each of the following examples, the matrix was fired in the presence of hydrocarbon in a furnace having a reducing atmosphere, whereby carbon was caused to combine with the matrix. The procedure which was employed for this treatment differed from one group of examples to another, as will hereinafter be described.

EXAMPLES 1 TO 3 AND 4 AND 5

The matrix "A" in the form of a plate was employed in each of Examples 1 to 3, and the matrix "A" in the form of a powder in each of Examples 4 and 5. In all of these Examples, the furnace temperature at the moment when carbon began to be introduced was the same and the same kind of hydrocarbon was supplied into the furnace at the same rate, but the length of time for which the hydrocarbon was introduced into the furnace was varied from one Example to another (see Table below), whereby radiowave absorbers having different amount of combined carbon were obtained.

EXAMPLES 6 AND 7

The matrix "A" in a granular form having a particle size of 2 to 6 mm was employed in each of these Examples. The same kind of hydrocarbon was supplied into the furnace at the same rate for the same length of time in these two Examples, but furnace temperatures at the moment when carbon began to be introduced were different from one Example to the other, whereby radiowave absorbers having different amount of combined carbon were obtained (see Table below).

EXAMPLES 8 AND 9

The matrix "B" in the form of a plate was employed in each of these Examples. The furnace temperature when carbon began to be introduced was the same and the same kind of hydrocarbon was supplied into the furnace at the same rate, but for different lengths of time, whereby radiowave absorbers having different amount of combined carbon were obtained (see Table below).

EXAMPLES 10 TO 16

The matrix "C" in the form of a plate having a cell number of 6 was employed in each of Examples 10 to 13, and the matrix "C" in the form of a plate having a cell number of 13 in each of Examples 14 to 16. The cell number is a measure of the mesh size of a ceramic foam and means the number of the cells lying in a straight line having a length of one inch on the surface of the foam. The same furnace temperature was employed, and the same kind of hydrocarbon was supplied into the furnace at the same rate, but for different lengths of time, whereby radiowave absorbers having different carbon contents amount of combined carbon were obtained (see Table below).

EXAMPLES 17 TO 20

The matrix "C" form of a plate having a cell number 6 was employed in Example 17, and the matrix "C" in the form of a plate having a cell number of 13 was employed in each of Examples 18 to 20. The furnace temperature at the moment when carbon began to be introduced was the same, and the same kind of hydrocarbon was supplied into the furnace at the same rate, but for different lengths of time, whereby radiowave absorbers having different amount of combined carbon were obtained (see Table below).

Each of the absorbers obtained in Examples 1 to 20 was examined for its radiowave absorption characteristics by employing the apparatus shown in the drawing, a method for directly measuring the amplitude of the space standing wave caused by a vertically incident wave having a frequency of 9.4 MHz. The reflectance, transmittance and absorptance of each absorber calculated are shown in the Table below.

Referring to the drawing, the apparatus comprises a klystron 1, an attenuator 2, a standing wave detector 3, a VSWR meter 4, a screw slub tuner 5, electromagnetic horns 6 and 7, a thermistor mount 8, and a power meter 9. The letter "s" means a sample (absorber). The horns 6 and 7 had a distance of 3 m therebetween.

In the Table below, the flow rate of hydrocarbon is shown as the amount thereof per $m^3$ of the volume of the furnace. Each of the absorbers in a powdery or granular form was examined by forming a powdery absorber layer having a thickness of 2 mm or a granular absorber layer having a thckness of 15 mm in a vessel made of polystyrene foam.

EXAMPLE 21

The absorber which had been prepared in Example 4 from the matrix "A" in the form of a powder having a particle size of 50 microns was dispersed in a vinyl resin to form a mixture having an absorber content of 50% by volume. A sample having a thickness of 10.2 mm was prepared from the mixture. The sample was lined with a metal plate and its radiowave absorption characteristics were determined by employing a wave having a frequency of 9.4 MHz. It exhibited a reflectance not exceeding 0.23%. This result confirms the excellent radiowave absorption characteristics of a composite material formed by employing the absorber of this invention in powdery form.

for a period of 6 to 65 minutes continuously when said temperature is higher than 500° C.

3. A process as set forth in claim 1, further including crushing said matrix into a powdery or granular form after combining carbon with porous ceramic matrix in the first and second processes.

4. A process as set forth in claim 1, further including crushing said matrix into a powdery or granular form after crushing the sintered porous ceramic matrix into a powdery or granular form in the first process.

| | Radiowave absorber | | | | | | | | Wave absorption characteristics | | |
|---|---|---|---|---|---|---|---|---|---|---|---|
| | Matrix (Cell number) | Shape | Thickness or particle size | Temp. of reducing atmosphere furnace | Hydrocarbon employed | Flow rate of hydrocarbon | Duration of hydrocarbon supply (min.) | Carbon content (wt. %) | Reflectance (%) | Transmittance (%) | Absorbance (%) |
| Example 1 | A | Plate | 30 mm | 880 | Industrial fuel gas (butane, propane) | 40 | 10 | 0.096 | 3.87 | 0.99 | 95.14 |
| Example 2 | A | Plate | 14 mm | 880 | Industrial fuel gas (butane, propane) | 40 | 20 | 0.22 | 11.11 | 0.19 | 88.70 |
| Example 3 | A | Plate | 14 mm | 880 | Industrial fuel gas (butane, propane) | 40 | 60 | 1.58 | 58.48 | 0.19 | 41.33 |
| Example 4 | A | Powder | 50 μm | 880 | BP gas | 40 | 30 | 0.31 | 19.80 | 27.30 | 52.90 |
| Example 5 | A | Powder | 150 μm | 880 | BP gas | 40 | 50 | 0.98 | 17.0 | 9.91 | 73.09 |
| Example 6 | A | Granular | 2–6 mm | 700 | A heavy oil | 1.3 | 30 | 0.49 | 6.15 | 3.22 | 90.63 |
| Example 7 | A | Granular | 2–6 mm | 900 | A heavy oil | 1.3 | 30 | 0.82 | 8.75 | 1.98 | 89.27 |
| Example 8 | B | Plate | 10 mm | 880 | BP gas | 40 | 20 | 0.17 | 1.51 | 10.65 | 87.84 |
| Example 9 | B | Plate | 12 mm | 880 | BP gas | 40 | 45 | 1.18 | 3.13 | 15.22 | 81.65 |
| Example 10 | C(#6) | Plate | 30 mm | 840 | BP gas | 40 | 7 | 0.06 | 1.70 | 46.01 | 52.29 |
| Example 11 | C(#6) | Plate | 30 mm | 840 | BP gas | 40 | 20 | 0.2 | 0.83 | 8.31 | 90.86 |
| Example 12 | C(#6) | Plate | 30 mm | 840 | BP gas | 40 | 40 | 0.95 | 15.52 | 0.71 | 83.77 |
| Example 13 | C(#6) | Plate | 30 mm | 840 | BP gas | 40 | 50 | 1.47 | 16.96 | 0.27 | 82.77 |
| Example 14 | C(#13) | Plate | 15 mm | 840 | BP gas | 40 | 20 | 0.2 | 1.70 | 2.88 | 95.42 |
| Example 15 | C(#13) | Plate | 15 mm | 840 | BP gas | 40 | 45 | 1.25 | 23.73 | 4.68 | 71.59 |
| Example 16 | C(#13) | Plate | 15 mm | 840 | BP gas | 40 | 60 | 2.02 | 46.93 | 0.61 | 52.46 |
| Example 17 | C(#6) | Plate | 29 mm | 1050 | Domestic propane gas | 39 | 12 | 0.95 | 15.52 | 0.71 | 83.77 |
| Example 18 | C(#13) | Plate | 28 mm | 1050 | Domestic propane gas | 39 | 8 | 0.14 | 4.92 | 0.69 | 94.39 |
| Example 19 | C(#13) | Plate | 28 mm | 1050 | Domestic propane gas | 39 | 12 | 0.39 | 10.37 | 0.64 | 88.99 |
| Example 20 | C(#13) | Plate | 30 mm | 1050 | Domestic propane gas | 39 | 15 | 0.94 | 19.75 | 0.66 | 79.59 |

What is claimed is:

1. A process for manufacturing a radiowave absorber comprising:
   the first process of firing at least one kind of ceramic material with a pore- or skeleton-forming material which can be burned away, whereby a sintered porous ceramic matrix is prepared, said ceramic material being selected from natural minerals and clay minerals and artificial ceramic materials; and
   the second process of firing said matrix in a furnace containing a reducing atmosphere and having a uniform temperature, while introducing a gas or mist of a hydrocarbon compound into said furnace.

2. A process as set forth in claim 1, wherein said hydrocarbon compound is introduced into said furnace 5. A process for manufacturing a radiowave absorber comprising:
   a first process of firing at least one kind of ceramic material with a pore- or skeleton-forming material which can be burned away, whereby a sintered, porous, ceramic matrix is prepared, said ceramic material being selected from the group consisting of natural minerals, clay minerals, and artificial ceramic materials; and
   a second process of firing said matrix in a furnace containing a reducing atmosphere and having an uniform temperature, while introducing a gas or mist of a hydrocarbon into said furnace for a period of 6 to 65 minutes, substantially continuously, and wherein said furnace temperature is greater than 500° C.

* * * * *